US005160870A

United States Patent [19]

Carson et al.

[11] Patent Number: 5,160,870

[45] Date of Patent: Nov. 3, 1992

[54] ULTRASONIC IMAGE SENSING ARRAY AND METHOD

[76] Inventors: Paul L. Carson, 5903 Fox Hollow Ct., Ann Arbor, Mich. 48105; Dale W. Fitting, 2785 Heather Rd., Golden, Colo. 80401; Andrew L. Robinson, 2765 Manchester Rd., Ann Arbor, Mich. 48104; Fred L. Terry, Jr., 1410 Judd Rd., Saline, Mich. 48176

[21] Appl. No.: 543,267

[22] Filed: Jun. 25, 1990

[51] Int. Cl.[5] .......... H01L 41/08

[52] U.S. Cl. .......... 310/339; 310/324; 310/334; 310/338; 310/800

[58] Field of Search .......... 310/311, 324, 334, 338, 310/339, 366, 800

[56] References Cited

U.S. PATENT DOCUMENTS

| | | | |
|---|---|---|---|
| Re. 32,180 | 6/1986 | Lewiner et al. | 310/800 |
| 3,940,637 | 2/1976 | Ohigashi et al. | 310/339 |
| 4,456,850 | 6/1984 | Inoue et al. | 310/324 |
| 4,473,769 | 9/1984 | Nguyen | 310/334 |
| 4,539,554 | 9/1985 | Jarvis et al. | 310/339 X |
| 4,555,953 | 12/1985 | Dario et al. | 310/338 X |
| 4,556,812 | 12/1985 | Kline et al. | 310/324 |
| 4,633,123 | 12/1986 | Radice | 310/339 |
| 4,672,591 | 6/1987 | Breimesser et al. | 310/334 X |
| 4,783,821 | 11/1988 | Muller et al. | 310/324 X |
| 4,857,887 | 8/1989 | Iten | 310/339 X |

OTHER PUBLICATIONS

D. Holm & G. Hess, "A Subminiature Condenser Microphone with Silicon Nitride Membrane and Silicon Back Plate", J. Acoust. Soc. Am., vol. 85(1), pp. 476–480 (Jan. 1989).

Doctoral Dissertation by R. G. Swartz entitled "Application of Polyvinylidene Fluoride to Monolithic Silicon Polyvinylidene Flouride Transducer Arrays", Stanford University, 1979, pp. 163–167.

*Primary Examiner*—Mark O. Budd

*Attorney, Agent, or Firm*—Harness, Dickey & Pierce

[57] ABSTRACT

An ultrasonic sensing array having ultrasonic transducer elements formed on a micromachined single-crystal semiconductor wafer provided with a deep recess under each transducer. Etch-altering dopants are diffused into the water to form rimmed support structures for dielectric stress-balanced elements. Composite dielectric layers are grown on both surfaces of the wafer. One composite layer serves as a diaphragm underlying the transducer elements. The other composite layer serves as a mask for etching away the substrate under each transducer element to form the deep recess while leaving the support structures and diaphragm layer. The resulting hollow or recess under each transducer element reduces the parasitic capacitance between the transducer and support substrate. The transducer elements are made by forming conductive bottom plates on the dielectric diaphragm layer, adding a piezoelectric polymer layer and thereafter forming the conductive top plates. The resulting ultrasonic sensors are capable of operation over a wide variety of frequencies with improved sensitivity and decreased acoustic crosstalk between sensor elements. Switching transistors may also be fabricated as part of the patterned semiconductor substrate.

14 Claims, 4 Drawing Sheets

FIG - 3
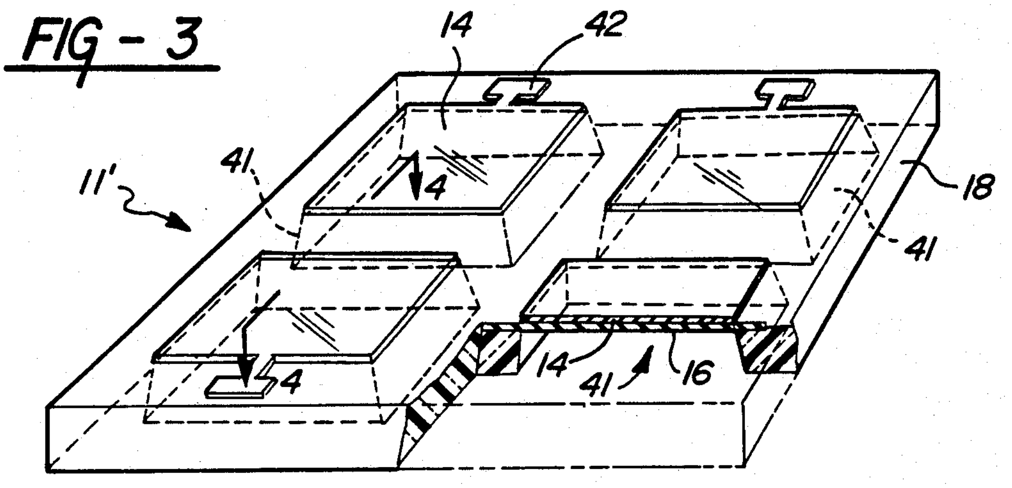
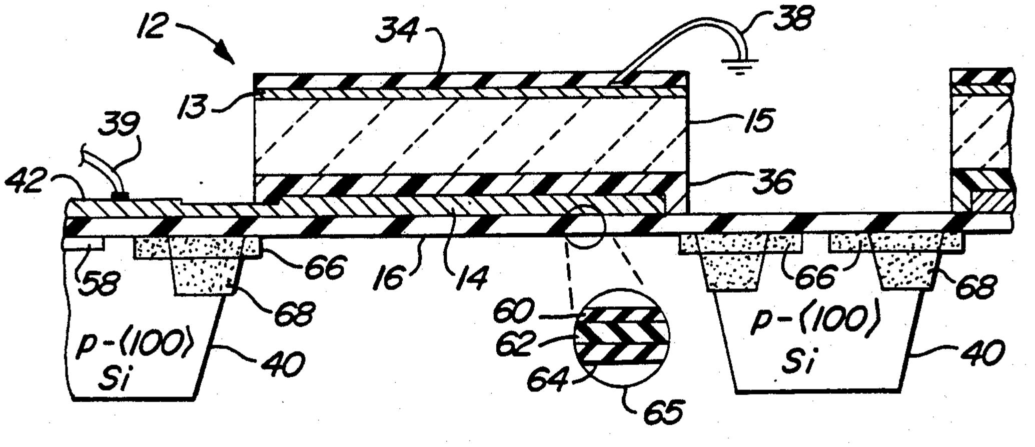
FIG - 4
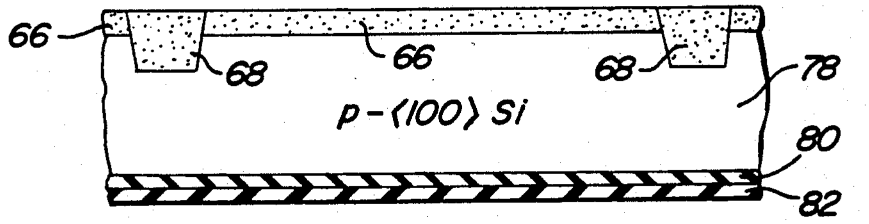
FIG - 5A

FIG-5B
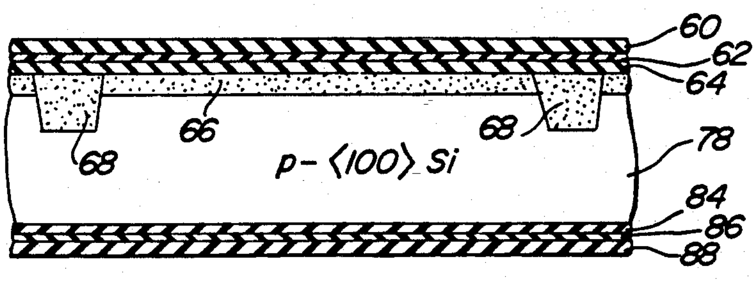
FIG-5C
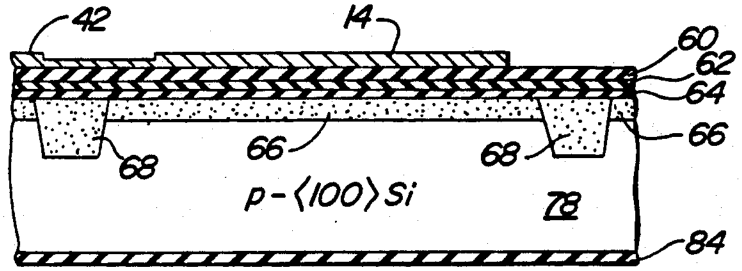
FIG-5D
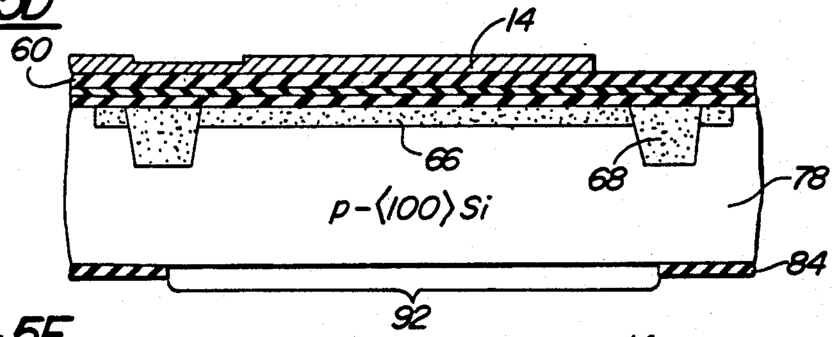
FIG-5E
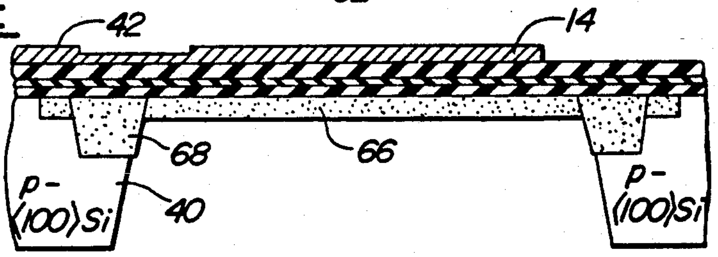
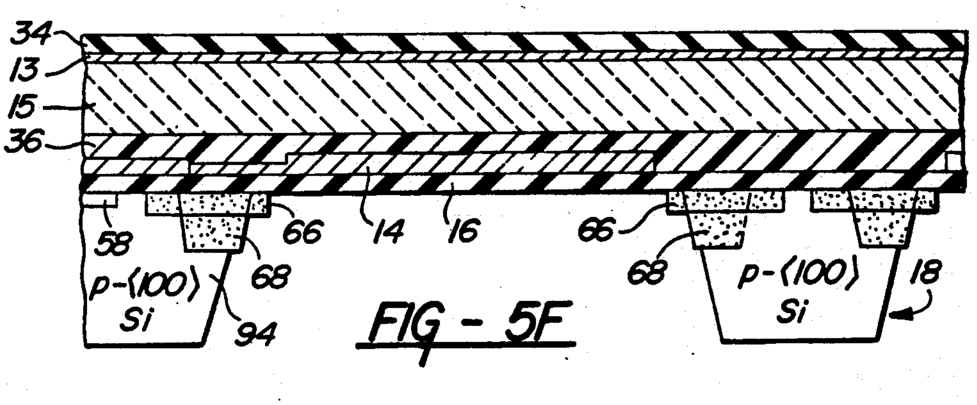
FIG-5F

ULTRASONIC IMAGE SENSING ARRAY AND METHOD

BACKGROUND OF THE INVENTION

1. Field of the Invention

This invention relates in general to arrays of miniature ultrasonic transducers, and in particular to ultrasonic imagers having an array of sensors on a micromachined support substrate.

2. Discussion

The need for accurate ultrasonic sensors has grown with advances in medical diagnosis and other diagnostic fields. With well-developed silicon integrated circuit technology available for design and fabrication purposes, a large number of small size transducers may be fabricated on a wafer substrate, with the potential for further integration of on-chip signal processing circuitry. Large arrays of small size transducers help improve image quality, which is important in medical imaging and non-destructive evaluation. See, D. W. Fitting, *IEEE Trans. Ultrason. Ferroelec. Freq. Contr.*, UFFC-34, p.346 (1987).

The use of the piezoelectric polymer polyvinylidene difluoride (PVDF) material has been of interest in acoustic imaging and non-destructive evaluation since its discovery because of its strong piezoelectricity, low acoustic impedance (small mismatch with those of water and biological tissues) and flexibility. See H. Kawai, "The Piezoelectricity of Polyvinylidene Fluoride," *Japan Journal of Applied Physics,* Vol. 8, p. 975 (1969).

There has been great interest in the use of PVDF transducers mounted on substrates with conventional integrated circuit technology. See R. G. Schwartz & J. D. Plummer, "Integrated Silicon PVDF Acoustic Transducer Arrays," *IEEE Trans. on Electron Devices,* Vol. ED-26, pp. 1921–1931 (1979). Applications of PVDF on ultrasonic sensors have provided improved bandwidth and greater sensitivity and acceptance angle in a liquid environment.

Recently, another piezoelectric material, a copolymer of vinylidene fluoride and trifluorethylene known as P(VDF-TrFE), has received attention for use in solid-state ultrasonic sensing arrays, since it is more compatible with conventional integrated circuit processing technology. See, T. Furukawa et al, "Ferroelectric behavior in the copolymer of vinylidene fluoride and trifluoroethylene," *Japan J. Appl. Phys.,* Vol. 19, pp. L109–L112 (1980); T. Yamada et al, "Ferroelectric to paraelectric phase transition of vinylidene fluoride-trifluoroethylene copolymer," *J. Appl. Phys.,* Vol. 52(2), pp. 948–952 (1981); H. Ohigashi et al, Piezoelectric and ferroelectric properties of P(VDF-TrFE) copolymers and their application to ultrasonic transducers," Ferroelectrics, Vol. 69, pp. 263–276 (1984). Its piezoelectricity and acoustic impedance appears to be comparable to or even somewhat superior to those of PVDF for ultrasonic transducers. See, A. Fiorillo et al, "Spinned P(VDF-TrFE) copolymer layer for a silicon-piezoelectric integrated US transducer," 1987 *Ultrasonics Symposium,* pp.667–670 (1987). This copolymer can be spun on a silicon wafer, poled, and patterned and etched with a reactive ion etch (RIE). See, e.g., N. Yamauchi, "A metal-insulator-semiconductor (MIS) device using a ferroelectric polymer thin film in the gate insulator," *J. Appl. Phys.,* Vol. 25(4), pp. 590–594 (1986).

A well-known technique in the ultrasonic sensing array arts for helping reduce electrical and acoustical cross-coupling effects between neighboring elements of the sensing array involves isolating the active transducer elements from one another by etching away the piezoelectric material in between the elements. See, C. Bruneel et al, "Electrical coupling effects in an ultrasonic transducer array," *Ultrasonics,* (November, 1989).

However, current large array ultrasonic sensors, mounted on silicon substrates and utilizing PVDF or P(VDF-TrFE), still have several shortcomings which limit desirable performance. A large parasitic capacitance between the lower electrode of the sensor and conductive (or semi-conductive) substrate on which it is mounted shunts the input to the processing circuitry and causes sensitivity loss. Also, lateral propagation of electrical signals and acoustic waves causes crosstalk between elements in the sensor array. This is illustrated in FIG. 1, which is a simplified cross-sectional diagram of a silicon semiconductor substrate 1 with several ultrasonic sensing elements 2 on its top surface. The substrate 1 is thick enough (e.g., around 150 to 500 microns) to sustain bulk waves at typical diagnostic ultrasonic frequencies (e.g., 1 MHz through 50 MHz). FIG. 1 shows that a single incoming wave 3 can generate a large number of reverberations 4 and 5, and remote wave leakage, represented by arrows 6, 7 and 8. This occurs because single-crystal silicon is a relatively unattenuating material. Note that the FIG. 1 diagram only shows longitudinal waves, and neglects shear and surface waves, which further compound this problem of crosstalk. Finally, the high propagation velocity of acoustic waves in silicon substrate may seriously limit the acceptance angle of a transducer array through crosstalk. As the size of each sensor elements is diminished for greater integration, any sensitivity loss from already small signals degrades performance.

One possible way of overcoming some of the foregoing problems is to increase radiated ultrasonic power, so that the reflected signals from the object to be detected are stronger, and therefore may be more easily distinguished from one another. However, in many biomedical applications, ultrasound procedures requiring fine resolution of soft internal tissue structures such as organs within the human body are already being carried out at the maximum allowed power. Thus, simply increasing the ultrasonic power input into such internal tissue structures to further improve image resolution structures is not possible. In order to effect higher resolution images, some other improvements in the signal-to-noise ratios produced by ultrasonic image sensing arrays are therefore required. In other words, sensing arrays must be designed and constructed to produce a higher resolution image for a given input power level if ultrasonic biomedical imaging of soft tissue structures is to improve.

In light of the foregoing problems and shortcomings, it is an object of the present invention to provide a high performance multi-element ultrasonic sensor array for use in applications where high density and accuracy are important.

A further object of the present invention is to provide a multi-element ultrasonic transducer array which provides better image quality by greatly reducing the parasitic capacitance between sensor electrodes and substrates, and yielding an increased signal output.

Yet another object of the present invention is to reduce crosstalk between neighboring sensor elements, which also increases image accuracy and acceptance angle of the array. A related object is to improve the signal-to-noise ratio of ultrasonic arrays, which also will permit higher resolution images to be obtained.

Still another object of the present invention is to increase the frequency range of signals which the ultrasonic sensor array may detect.

One more object is to provide a method to fabricate an ultrasonic sensor with a robust diaphragm and supporting structure that can tolerate the removal of the substrate under the sensor.

SUMMARY OF THE INVENTION

In order to achieve most if not all of the foregoing objects, there is provided in accordance with a first aspect of the present invention, an ultrasonic sensing array having a plurality of piezoelectric transducers, each of which is responsive to ultrasonic forces applied thereto. The ultrasonic sensor array comprises: a micromachined support substrate; a diaphragm layer formed on one side of the substrate; and the plurality of piezoelectric transducers, which are preferably patterned so as to be separated acoustically in at least one lateral dimension from one another. The plurality of transducers includes: a first plurality of electrically conductive plates laterally spaced from one another on a side of the diaphragm layer opposite the substrate, with each such plate being associated with a distinct one of the transducers; at least one layer of piezoelectric material bonded to the first plurality of electrically conductive plates; and a second plurality of electrically conductive plates laterally spaced from one another and bonded to a side of the piezoelectric material opposite the first plurality of electrically conductive plates. Each such plate of the second plurality of plates may be associated with a distinct one of the transducers and a distinct one of the first plurality of electrically conductive plates. Note that, if desired, the second plate may be substantially continuous, so that it forms a common electrode. Similarly, the piezoelectric material may be substantially continuous.

The micromachined support substrate is preferably made of single-crystal semiconductor material, such as silicon semiconductor material. One preferred support substrate features a stress-balanced (or stress-free) dielectric diaphragm layer upon which ultrasonic piezoelectric transducers are formed. Micromachining, including wet and dry etches, is used to remove those portions of the single-crystal substrate which are under the transducer elements. This significantly reduces the large parasitic capacitance which would otherwise be present if such transducer elements were supported with continuous conductive substrate. This micromachining of the substrate produces deep recesses or holes beneath the transducer elements. When this procedure is carried out for an x-y matrix of sensor elements, the silicon substrate resembles a waffle or honeycomb. Further, the overall thickness of the substrate directly beneath the sensing elements is quite thin in comparison to the thickness of the transducer elements and the acoustical backing which may be optionally provided. This results in certain distinct benefits which will now be discussed.

A major aspect of each of the ultrasonic imaging arrays of the present invention is the use of a thin silicon substrate, which can also serve as a platform for the integrated electronic devices or circuits used to operate the sensor elements. The thin substrate of the present invention does not cause acoustic artifacts associated with thicker conventional electronic substrates.

One advantage of using such a thin substrate layer may be demonstrated by the following analysis. Consider a plate of material of thickness L, bulk acoustic impedance $Z_0$, with a front and backing material acoustic impedance $Z_1$, and $Z_3$, respectively. The fraction of the energy reflected and transmitted for ultrasound of wavelength λ and incident perpendicular to the layer are:

$$I_R/I_1 = [(m-1)/(m+1)]^2 \quad (1)$$

$$I_3/I_1 = [4m/(m+1)]^2\text{, and where} \quad (2)$$

$$m = Z_2/Z_1\text{, and} \quad (3)$$

the input impedance of the plate as viewed from material 1 is $$z_2 = z_0(z_3 + jz_0 \tan 2\pi L/\lambda)/]z_0 + jz_3 \tan 2\pi L/\lambda). \quad (4)$$

As the layer gets thin compared with a wavelength, i.e., $L/\lambda << 0$, $\tan 2\pi L/\lambda \geqq 0$ and the plate essentially becomes nonexistent, i.e., $z_2 = z_3$. Then the energy reflected from or transmitted through the plate becomes that which would be reflected or transmitted from the backing alone.

Thus one can back the transducer elements the support plate thereunder with a very low or high acoustic impedance material that will reflect all the energy passing through the elements, so that more energy can be actively absorbed in the transducer elements, increasing the transducer sensitivity. Alternatively, the backing can be acoustically matched to the transducer element, so all the mechanical energy initially getting through the element passes into the absorptive backing, again without interference from the thin support plate. This makes the transducer elements responsive to a broad range of frequencies.

Of at least equal importance to the above flexibility in selecting acoustical backing materials, is that the weak acoustic interaction of the thin support substrate reduces the amount of acoustic energy vibrating in and along the substrate. This is perhaps the most fundamental advantage offered by the ultrasonic imaging arrays of the present invention, because it minimizes the energy which can leak from one piezoelectric element in an array to another. Such energy leakage, or crosstalk, gives an inaccurate representation of the received acoustic field pattern or realization of the intended transmission pattern. Even a small leakage of 1/100th of the energy (−20 dB) between remote elements, or even adjacent elements, will significantly limit the degree to which well-defined ultrasound beams can be formed to image and otherwise probe objects of highly variable reflectivity, which are common throughout body tissues or composite materials.

A thick support substrate such as that shown in FIG. 1 has the potential to reflect acoustic waves from its front and back surfaces, either coherently or incoherently, as a function of the substrate thickness and the wave frequency. This makes for very complex crosstalk as a function of frequency, as previously alluded to in the earlier discussion of FIG. 1.

In contrast, the support substrates of the ultrasonic transducer arrays of the present invention which have waffle or honeycomb-like structures of interconnected ridges protruding from a very thin continuous layer of single-crystal material. Thus, most of what little energy might be transferred to surface waves along the back side of the thin (or even a relatively thick) silicon layer will be reflected by a steeply angled ridge rising sharply along a thicker portion of the ribbed silicon substrate. Thus, these narrow ribs, produced by micromachining, not only provide structural strength for the silicon layer, they also improve the ultimate acoustical (and possibly electrical) isolation achievable between the transducer elements.

These and other aspects, advantages and objects of the present invention may be further understood by referring to the detailed description, accompanying Figures and appended claims.

BRIEF DESCRIPTION OF THE DRAWINGS

The drawings from an integral part of the description of the preferred embodiments and are to be read in conjunction therewith. For ease of illustration and to render the embodiments more understandable, the various layers and features in the FIGS. are not shown to scale. Identical reference numerals designate like layers or features in the different Figures and embodiments, where:

FIG. 3 is a simplified perspective view of a 2 by 2 (i.e., 4 sensing element) ultrasonic imaging array of the present invention. which uses a support substrate of single-crystal semiconductor material that has been micromachined to remove virtually all of the substrate material underlying each of the diaphragms of the four sensing elements;

FIG. 4 is a fragmentary side cross section of one ultrasonic sensing element of the FIG. 3 array taken along line 4—4 of FIG. 3;

FIGS. 5A through 5F illustrate successive partially formed structures which are used to explain a preferred method for fabricating the ultrasonic sensing array shown in FIG. 4;

DETAILED DESCRIPTION OF THE PREFERRED EMBODIMENTS

Figure 1:
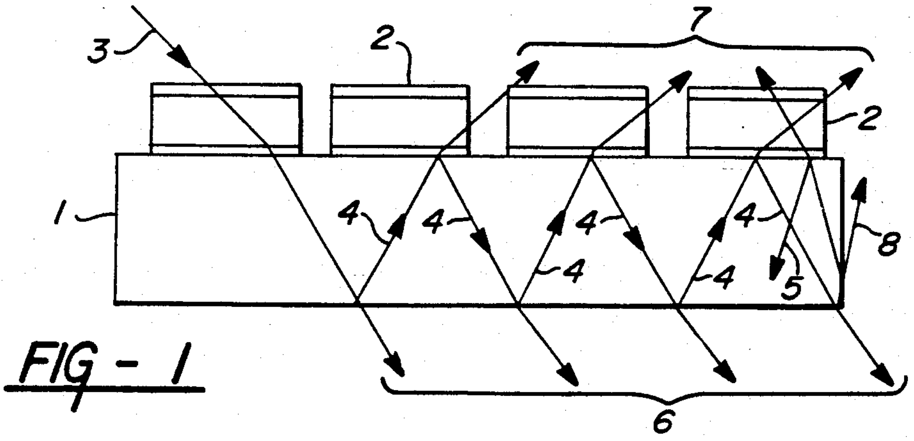
FIG. 1 is a simplified diagram illustrating the acoustical reverberations and remote wave leakage which occurs in a conventional prior art ultrasonic sensing array fabricated on a solid silicon substrate.
Figure 2:
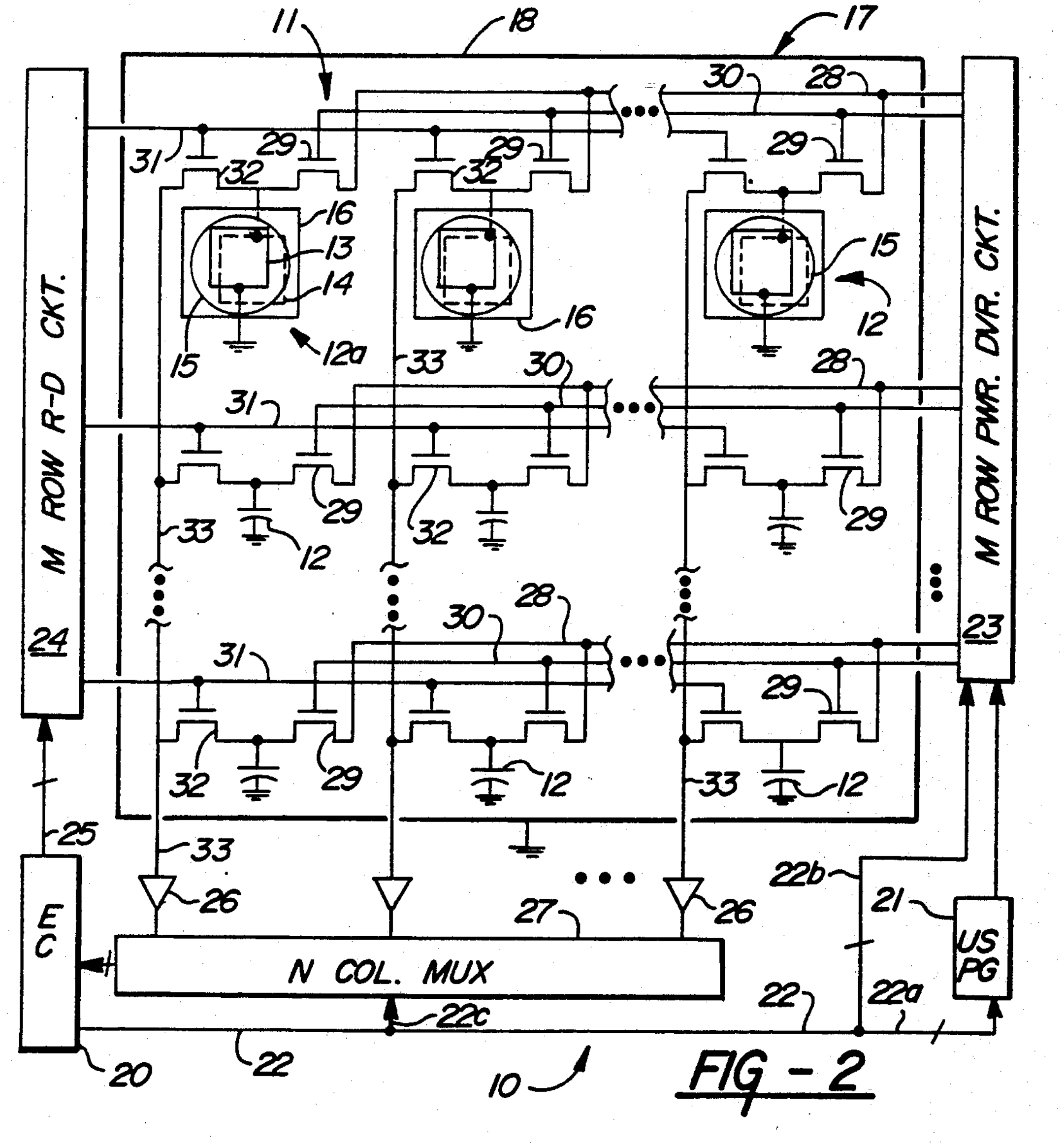
FIG. 2 is an overall block diagram of an ultrasonic sensor system of the present invention including the ultrasonic sensing array of the present invention and associated circuitry.

Referring now to FIG. 2, there is shown an ultrasonic imaging system 10 of the present invention. One arrangement of the system may be comprised of the ultrasonic imaging array 11, which may be an M row×N column matrix of piezoelectric ultrasonic sensors 12. Each of the sensors 12 includes, as illustrated by the upper left sensor 12*a*, an upper electrode 13 and a lower electrode 14 separated from another by a substantially electrically insulative semi-flexible piezoelectric layer 15, which is shown as a circle but may be a rectangle or other shape. The upper and lower electrodes 13 and 14 and layer 15 are supported on an underlying very thin electrically insulative diaphragm 16. For ease of illustration, the sensors 12 in rows 2 and M in the array 11 are represented by the familiar symbol for a capacitor. Those in the art will appreciate that the ultrasonic imaging array 11 may be constructed if desired with either M or N (but not both) equal to 1. Typically, however, both M and N will be a much larger value such as 8, 12, 16, 32, 48, 64 or more. As will become clear from the following description, arrays of the type shown in FIG. 2 may be fabricated in almost any desired size and/or configuration using the methods of the present invention.

The ultrasonic array 11 is fabricated on a support structure 17 including a rigid substrate 18 preferably made of single-crystal silicon semiconductor material, which hereafter may also be referred to as chip 18. The imaging system 10 of FIG. 2 also includes a number of conventional electronic circuits or subsystems, namely: an electronic controller 20 which may include a programmed microprocessor, memory, digital I/O ports and if desired high-speed dedicated signal processing circuits for performing preliminarily image processing; an ultrasonic power generator (USPG) circuit 21 operating under the control of command signals received from the controller 20 over multiple-conductor signal paths 22 and 22*a*; an M row power driver circuit 23 for distributing the ultrasonic power from USPG circuit 21 to the sensors 12 in the rows 1 through M of the array 11 in the manner (i.e., timing and sequence) specified by control commands received from the controller over signal paths 22 and 22*b*; a row readout circuit 24 for selectively enabling the sensors 12 in rows 1 through M in the manner specified by control commands received from the controller 20 over multiple-conductor signal path 25; N analog amplifier circuits 26 to strengthen and condition the readout signals produced by the ultrasonic sensors 12, and a multiplexer circuit 27 to sample, hold and transfer to analog readout signals over signal path 28 to one or more high speed analog-to-digital converters within the controller 20 in the manner (i.e., timing and sequence) specified by control commands received from controller 20 over signal paths 22 and 22*c*. Alternatively, the multiplexer circuit 27 itself may include the needed A/D converters, so that only digital information need be transferred to the controller 20. Those skilled in the art should be quite familiar with various designs for and different methods of operating the circuits 21, 23, 24, 26 and 27, and thus such details will not be discussed here.

The array 11 is preferably organized in a two-dimensional X-Y array as shown in FIG. 2. Each sensor 12 may be provided with transmit ultrasonic (US) power from circuit 23 over its respective US power line 28.

Power transistors 29 are turned on by signals provided by circuit 23 over control lines 30. The row read-out lines 31 are used to select rows of sensors 12 by turning on the low-power transistors 32. The transistors 29 and 32 may each be fabricated in and the chip 18, prior to fabrication of the US sensors 12. The US pressure levels experienced by each particular row of sensors 12 selected for read-out produce minute time-varying charges or voltages which are delivered by column readout lines 33 to amplifiers 26 as each row read-out line 31 is activated. These US pressure levels are digitized and further processed in conventional manner by the controller 20.

FIG. 3 shows a prototype imaging array 11' with four individual sensors 12, with only the lower electrode of the sensors shown for clarity. The individual sensors 12 rest on a patterned support substrate 18. As pictured in FIG. 3, each individual sensor 12 may include suitable bonding pad 42, a lower electrode 14, and a piezoelectric polymer film layer 15 (not shown) above the lower electrode 14. The individual sensors are piezoelectric devices, which at US frequencies, may be modelled as pressure-sensitive capacitors since they change their charge and voltage values in proportion to the strength of sound waves sensed thereby. With a prototype of the array 11, we demonstrated that it is possible to use the hollows 41 under the sensors 12 to greatly decrease parasitic capacitance. Using the fabrication techniques described below, we were able to improve sensor performance by about 10 dB over a similar sensor without the substrate 18' removed. In addition, crosstalk was greatly reduced.

FIG. 4 shows the cross-section of one of the individual sensors 12 in FIG. 3. The sensor element 12 is covered with a protective layer of parylene 34, which may be 1 micron (1 μm) thick. The sensor 12 may be viewed as having a capacitor-like structure which is formed by an upper electrode 13 deposited on a polymer film layer 15, which in turn is bonded to the lower electrode 14 by a layer of conventional epoxy 36. The thickness of the polymer layer 15 will be dictated by the characteristics of the polymer film, and the US frequencies of interest. For example, for frequencies from 2 MHz to 20 MHz, the layer 15 may be 20 to 1000 microns thick, with approximately 150 microns being preferred for frequency ranges of around 5 MHz. The adhesive layer is typically a dielectric material, and may have a thickness in the range of 1 to 5 microns, and is preferably 2 to 3 microns thick. The polymer film layer may be PVDF, which has strong piezoelectricity, low acoustic impedance and flexibility. This material provides improved bandwidth and acceptance angle for the sensor from its low acoustic impedance. Alternatively, the polymer film pad may be constructed of the copolymer P(VDF-TrFE), which has superior processing compatibility. Wire leads 38 and 39 may be connected to the upper and lower electrodes 13 and 14 for providing the electrical connections needed to operate the sensor 12.

The support structure 17 under each sensor consists of several layers of material. The sensor rests upon a diaphragm 16 which is a stress-balanced composite dielectric. The diaphragm 16 itself is made of three layers to prevent buckling due to compressive stress during the bonding of the PVDF film. The diaphragm is composed of a top layer of deposited silicon oxide 60, a layer of deposited silicon nitride 62 and a bottom layer of silicon oxide 64, as shown in the detail circle 65 of FIG. 4. A stress-free or neutral-free diaphragm alternatively may be used, and can be fabricated by known methods.

The diaphragm 16 rests upon a support structure 17 composed of micromachined single-crystal silicon semiconductor substrate 18, of which a shallow layer 66 directly under the diaphragm is heavily diffused with boron. This layer 66 and a rim 68 encircling the perimeter of the sensor 12 is formed by a deep boron diffusion as mechanical support for the diaphragm. The substrate 18 under the lower electrode 14 is etched away up to the diffusion layers 66 and 68. The absence of the substrate under the sensor 12 significantly decreases parasitic capacitance from the substrate thereby increasing sensitivity. Also, the absence of the substrate helps minimize the amount of acoustic energy vibrating in and along the substrate 18, which helps decrease acoustic crosstalk between this sensor 12 and other sensors 12 in the array 11. Further, it helps reduce electrical crosstalk through the substrate as well. Finally the use of a silicon substrate allows the formation of other integrated circuit devices 58 in the substrate 18, which may be the transistors 29 and 32 for example. The proximity of the electronics to the sensing elements decreases wiring capacitance and increases signal levels to the readout electronics.

FIGS. 5A through 5F illustrate the fabrication process used to simultaneously make each of the force-responsive sensor elements 12 of array 11. The fabrication process for the ultrasonic imaging array starts with a conventional lightly doped p-type <100> silicon wafer 78, which might be anywhere from 150 microns to about 500 microns thick. A one micron thick layer 80 of silicon oxide is grown on each side of the wafer 78. This layer 80 is then covered with a 1500 Angstrom (Å) layer 82 of silicon nitride, which is deposited using low pressure chemical vapor deposition (LPCVD). The two layers 80 and 82 are then patterned using conventional photolithographic techniques to serve as a mask for the boron etch stop diffusion. A selective deep p+ boron diffusion is performed at 1175° C. for 16 hours, to create a doped etch stop area to a depth of about 15 microns deep, which doped area becomes the supporting rim 68. A shallow p+ boron diffusion is then performed at 1175° C. for 3 hours, which creates a second etch stop that is about 5 microns deep, that is used to create a heavily doped layer 66. The oxide and nitride layers 80 and 82 (shown on the bottom of the wafer 78 in FIG. 5A) are then stripped away using RIE and wet chemical etching, such as buffered hydrofluoric acid (B-HF), leaving the structure on top of the wafer 78 shown in FIG. 5A. (Note that layers 80 and 82 may also be stripped away at this point, if desired.)

FIG. 5B shows the formation of the diaphragm layer 16. First silicon oxide layers 64 and 84 are grown at 1100° C. simultaneously to a thickness of about 2000 Å on the top and bottom of the wafer 78. The nitride layers 62 and 86 then are deposited using LPCVD to a depth of 1500 Å at 820° C. The second silicon oxide layers 60 and 88 are deposited using LPCVD to a depth of 6500 Å at 920° C. The three layers 60, 62 and 64 form the stress-balanced diaphragm layer 16.

FIG. 5C shows the structure after chromium (Cr) and gold (Au) have been deposited to suitable thicknesses, such as 400 Angstroms and 2000 Angstroms respectively, and patterned to form the lower electrode 16 and bonding pad 42, as required or desired. The bottom layers of oxide 88 and nitride 86 have also been removed leaving the oxide layer 84 to serve as a mask for etching away the substrate.

FIG. 5D shows how etch windows, such as window 92, are defined by conventional photolithography using an infrared aligner on oxide layer 84. The oxide in these windows is then etched down to the wafer 78 by etching the oxide with B-HF. The silicon substrate under these windows is etched away with a mixture of ethylene-diamine-pyrocatechol (EDP) and water, which stops at the heavily doped layer 66 and rim 68, as shown in FIG. 5E. The resulting compound diaphragm consists of 1 μm composite dielectric layer 16 and the 5 μm p+ boron-doped silicon layer 66 with 10 μm p+ rim 68 thereunder and the remaining patterned lightly doped portions 94 of water 78 as a supporting ridge structure.

The wafer 78, which contains several arrays 11, each having multiple sensor structures as shown in FIG. 5E, is then diced into individual chips like chip 18. The formation of an individual sensor 12 on the chip 18 is shown in FIG. 5F. A non-conductive epoxy layer 36 is spun on one side of a 40 micrometer thick PVDF film 15 which has an Au layer forming the upper electrode 13 on the other side. Alternatively, the PVDF film may be replaced with P(VDF-TrFE), in which case the epoxy layer 36 is not required. Instead the P(VDF-TrFE) is spun or cast on top of the lower electrode and patterned as desired using RIE.

Next, the p+ heavily doped layer 66 is removed from under the lower electrode 14 by a suitable dry etch such as an RIE of $SF_6$ and $O_2$. The chip 18 may then be mounted to a conventional integrated chip package, and the upper electrode 13 and the substrate 78 are grounded. Finally connecting wires may be attached to the bonding pads 42 if desired, resulting the apparatus shown in FIG. 4.

Figure 6:
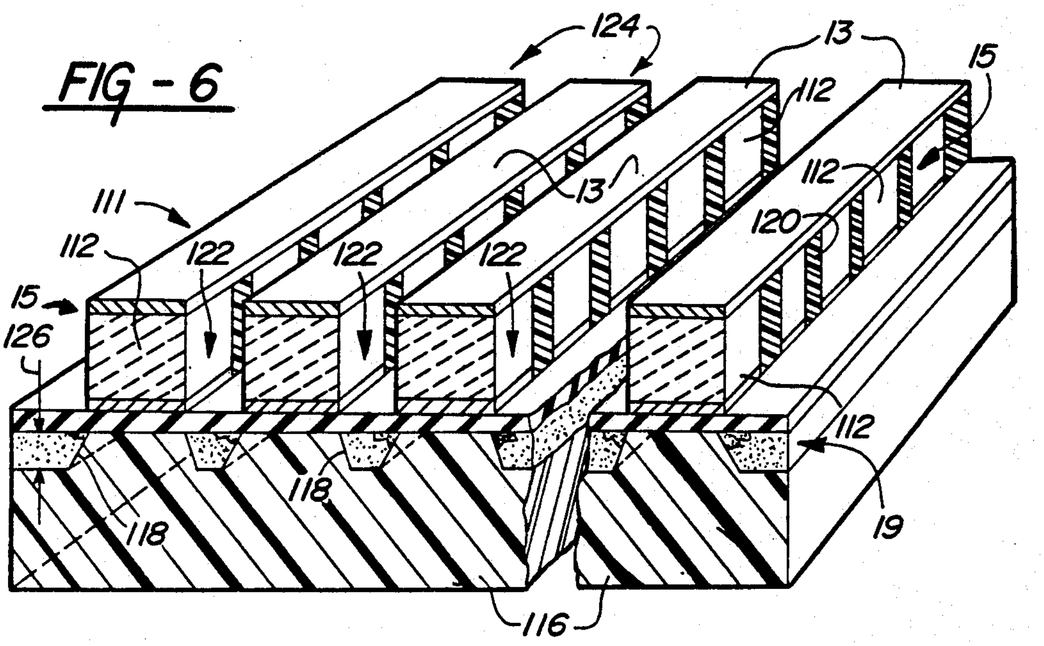
FIG. 6 is a perspective view in partial cross-section of a second embodiment of the ultrasonic imaging array of the present invention which includes acoustical backing material within the micromachined cavities of and under the single-crystal support substrate, to improve the overall performance of the array.

FIG. 6 shows another embodiment of the present invention, namely an ultrasonic sensing array 111 having a plurality of ultrasonic sensors 112 arranged in a matrix of 5 rows by N columns, and constructed on a micromachined support substrate 19 of the type previously described with respect to FIGS. 2 through 6. The ultrasonic sensors 112 may be constructed in the same basic manner as the sensor 12 in FIG. 4, whose fabrication has already been described. The array 111 differs from the array 11 of the first embodiment in that the support substrate 19 is backed with either a very low or a very high acoustical impedance material 116 relative to the frequency range of interest. As shown in FIG. 5, the acoustical material 116 may be made thick enough, not only to fill the hollows 118 under the sensors 112, but also to extend significantly below the substrate 19. In this manner, the material 116 may provide additional mechanical support for the substrate. If desired, however, the backing material 116 could alternatively be leveled off using conventional microelectronic leveling techniques so that it is resident only in the recesses 18, so that its total height was no more than the height of the recess, i.e., the dimension indicated by the arrow 126.

FIG. 6 also illustrates one convenient technique for interconnecting the top electrodes of transducer elements 112 in a common column, while maintaining acoustical separation between the sensor elements 112 of adjacent columns. This technique involves etching slots or spaces between adjacent rows of transducer elements before the top electrode layer 13 is deposited on the piezoelectric layer 15. Thereafter, these slots are filled with an acoustical material 120 which attenuates sound in the relevant frequency range, which is then leveled off even with the top of the piezoelectric layer. Thereafter, the top electrode layer 13 is deposited, and then this top layer, and the piezoelectric material thereunder is patterned as shown to form the slots 122 between the adjacent columns 124. Those skilled in the art will appreciate that, since the foregoing approach makes the individual columns separately addressable, phased array beam steering techniques may be used to provide directional control of the beam of radiated ultrasonic power from the sensors 112, which can thus be made to point at an angle or sweep along a desired horizontal vector parallel to the rows of transducer elements.

The backing material 116 may also be chosen to reflect all the energy passing through the transducer elements 112, so that more energy can be absorbed in the active elements, thus increasing sensitivity. The backing material may also be matched to the piezoelectric film so all the energy passing through the ultrasonic sensors passes through the backing without interference, thereby making the sensors responsive to a broader range of frequencies.

Figure 7:
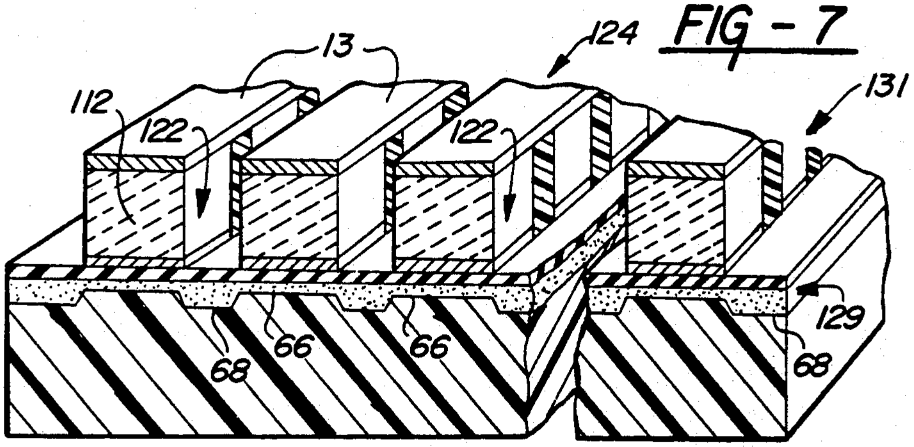
FIG. 7 is a perspective view in partial cross-section of a portion of a third embodiment of the ultrasonic imaging array of the present invention, which includes a single-crystal substrate which has been thinned to be only several microns thick, as a alternative technique for reducing acoustical crosstalk through the substrate.

FIG. 7 shows an ultrasonic sensing array 131 of the present invention that differs in construction from the FIG. 6 embodiment in two ways. First, the 5 micron etch-altering layer 66 is not removed. Such removal may not be necessary for example where the etch-altering layer 66 is a substantially electrically insulative material. This result could be obtained, for example by starting with a substantially non-conductive wafer, and then diffusing, implanting or otherwise injecting materials which can change preferential etching rates without rendering the regions electrically conductive. Further, as noted in the Summary above, when the substrate structure 19 becomes thin enough, it essentially disappears from an acoustical point of view, at least in certain frequency ranges of interest. In order to help achieve this goal of the making the substrate thin, the thicker rim structure 94 of substrate 19 can be preferentially etched entirely away, so that only the etch-altering regions 66 and 68 remain as part of the substrate 19. In other words the thickness of the patterned substrate shown in FIG. 5 is reduced to the thickness of region 68 produced by the deep diffusion of an etch-altering material into a wafer 78. As noted in the Summary, thinning out of the support substrate of the an ultrasonic sensing array also helps greatly reduce acoustical cross coupling effects, and may reduce electrical cross-coupling effects as well. Further, in cases where the transducer elements or the backing material have adequate structural rigidity without the regions 66 and 68, these layers may be further removed, leaving only the integrated circuits (if any) and conductive traces fabricated on the top of the substrate 78.

Figure 8:
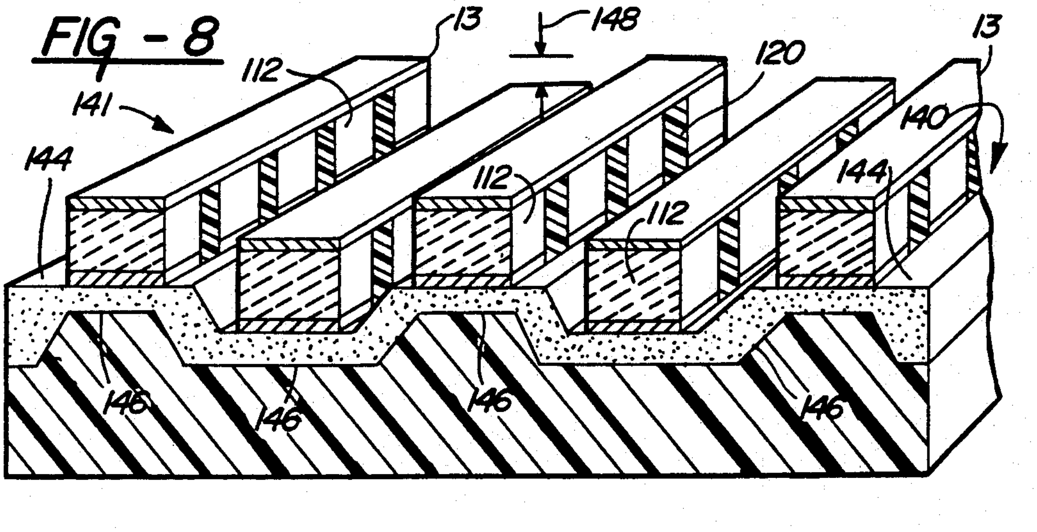
FIG. 8 is a perspective view in partial cross-section of a portion of a fourth embodiment of the ultrasonic imaging array of the present invention, which includes a single-crystal substrate which has patterned by micromachining techniques so that adjacent columns of ultrasonic sensors are at different heights, in order to, among other things, substantially reduce reflections of received signals back to the target.

FIG. 8 depicts yet another imaging array 141 of the present invention, which illustrates that the front face 144 and/or rear face 146 of a silicon support substrate 140 may be micromachined to provide a support structure having different levels for adjacent columns (or rows) of sensing elements 112. This feature can possibly be used to minimize beam grating lobes. More certainly, the uneven front face 134 of the sensing array 131 can be used to essentially eliminate coherent reflection back into body tissue, or other imaged object, of waves previously reflected from proximal layers in the body tissue or object. This elimination of strong reverberations between the ultrasonic transducer array 141 and the proximal strong reflectors being imaged would reduce one of the major sources of clutter in low signal areas of ultrasound images. This phase cancellation of reverberations is best accomplished with the silicon (or other) stepped layer being arranged such that every other transducer element in a given row (or column) is displaced vertically (in dimension indicated by arrows 148), as shown in FIG. 8, by $\frac{1}{2}$ or $\frac{1}{4}$ of the wavelength of ultrasound in the medium above the elements, depending, respectively, on whether the elements are of low or, as is usual, of high impedance relative to the medium above the sensing elements. The patterned support substrate 140 depicted in FIG. 8 may be achieved by applying the micromachining techniques described with regard to FIGS. 4 and 5 to both sides of the substrate 14.

It should be appreciated that the ultrasonic sensing arrays of the foregoing embodiments and the fabrication processes used to form them are well suited to achieve the objects above stated. It is recognized that those skilled in the art may make various modifications or additions to the preferred embodiments chosen to illustrate the invention without departing from the spirit and scope to the art. The processing circuitry may be modified for more complex amplification and signal processing. This may be accomplished, for example, by substituting an integrated pre-amplifier circuit with several transistors for each of the simple on-off transistors 32 depicted in FIG. 2.

The shape, size, material and thickness of the upper electrodes 13, piezoelectric film layers 15, lower electrodes 14, diaphragm layer 18 and substrate patterning may be varied to suit the intended applications for or desired response characteristics of the particular devices being fabricated. For example, where the transducer elements are self-supporting due to their inherent mechanical strength, it is not necessary to even use the composite diaphragm 18. The composite diaphragm 18 may have more or less layers of differing materials and thickness depending on the desired application. Different polymer and co-polymer materials may be selected for the piezoelectric films depending on process suitability and performance. Further, entirely different US transducer film materials may be employed, such as ceramics, electrostrictive materials, or crystalline piezoelectric films such as vacuum-sputtered zinc oxide or diced quarts. Also, the newer composite transducers typically consisting of active ceramic elements and a resin separation material would be particularly appropriate for use in the active layers of the ultrasonic sensing arrays of the present invention. Finally, any other electroacoustic materials responsive to ultrasonic frequencies may be employed.

In the embodiments chosen to illustrate the present invention, the acoustically separate piezoelectric sensor elements have been shown as rectangular solids, arrange din rectangular matrices. Those in the art should appreciate that the piezoelectric elements could be organized in various types of one-, two- or three-dimensional array patterns, including linear and annular arrays and various non-rectangular grids. Also, the sensing elements may be made cylindrical, rectangular, hexagonal or other shapes of rods. Also, they may be made of piezoelectric ceramic materials, as are used in many current composite transducers, perhaps with a low acoustical impedance, highly absorptive resin binding them in place to one another for structural integrity. The ultrasonic sensors could also be piezoelectric fibers, woven like a rug, with bonding of the ends of the tufts to the substrate. They could also be other polymer or copolymer elements, defined only by electrodes, electrodes plus spot polling, or by etching to form physically separate elements. Any of the configurations of the imaging arrays of the present invention may be used with additional layers of material for acoustic reflection or damping or for mechanical support, as may prove desirable.

The substrate material used with the various embodiments of the present invention is preferably single-crystal silicon semiconductor material, on account of the many available techniques for processing such material and allied materials used for fabricating transducer elements and associated integrated circuitry. However, other kinds of solid materials, whether or not single-crystal, which can be suitable patterned by any known or later developed micromachining techniques may also be used in place of the silicon substrates disclosed above. For example, gallium arsenide or sapphire substrates may be utilized.

With any of the ultrasonic imaging arrays of the present invention, the shear, longitudinal and surface wave velocity, impedance and absorption properties of the backing material (shown in FIGS. 6, 7 and 8, but applicable to all embodiments) can be optimized to further reduce surface waves in the silicon layer, by applying well-known rules of the physics of ultrasonic devices to the choice of materials, to the thicknesses of various layers, and the lateral dimensions of the structures disclosed in the present invention. For example, by applying such rules, the structures of the present invention may be successfully shrunk and adapted to much higher frequency ultrasound signals, for example in the range of 510 Mhz to 1.5 GHz, as used in various acoustical microscopes. Accordingly, it is to be understood that the present invention is not limited to the specific embodiments chosen to illustrate the invention, but should be deemed to extend to the subject matter defined by the appended claims, including all fair equivalents thereof.

We claim:

1. A micromachined ultrasonic sensing array having a plurality of piezoelectric transducers, each of which generates an electric signal corresponding to a mechanical force acoustically applied thereto, the array comprising:

- a patterned micromachined support substrate;
- a composite dielectric diaphragm layer formed on the substrate;
- a first plurality of electrically conductive plates spaced from one another and connectable to an external bonding pad and resting on the diaphragm layer, each such plate forming a first plate of a distinct one of the transducers;
- a plurality of patterned piezoelectric polymer film layers spaced from one another and bonded to the diaphragm layer and the first plurality of electrically conductive plates, said layers of piezoelectric film being responsive to ultrasonic acoustically applied forces;
- a second plurality of electrically conductive plates spaced from one another and resting on the piezoelectric polymer film layer, each such plate forming a second plate of a distinct one of the transducers; and
- electronic circuit means for detecting analog values of said electric signal generated by said piezoelectric layer in response to an ultrasonic acoustically applied mechanical force.

2. A micromachined ultrasonic sensing array having a plurality of piezoelectric transducers, each of which generates an electric signal corresponding to a mechanical force acoustically applied thereto, the array comprising:

a patterned support substrate;

a composite dielectric diaphragm layer formed on the substrate;

the composite dielectric diaphragm layer being composed of at least three layers;

the first such layer generally being silicon oxide;

the second such layer generally being deposited silicon nitride; and the third layer generally being deposited silicon oxide;

a first plurality of electrically conductive plates spaced from one another and connectable to an external bonding pad and resting on the diaphragm layer, each such plate forming first plate of a distinct one of the transducers;

a plurality of patterned piezoelectric polymer film layers spaced from one another and bonded to the diaphragm layer and the first plurality of electrically conductive plates; and a second plurality of electrically conductive plates spaced from one another and resting on the piezoelectric polymer film layer, each such plate forming a second plate of a distinct one of the transducers.

3. A micromachined ultrasonic sensing array having a plurality of piezoelectric transducers, each of which generates an electric signal corresponding to a mechanical force acoustically applied thereto, the array comprising:

a patterned support substrate which is a single crystal semiconductor material that is primarily silicon.

a composite dielectric diaphragm layer formed on the substrate;

a first plurality of electrically conductive plates spaced from one another and connectable to an external bonding pad and resting on the diaphragm layer, each such plate forming a first plate of a distinct one of the transducers;

a plurality of patterned piezoelectric polymer film layers spaced from one another and bonded to the diaphragm layer and the first plurality of electrically conductive plates; and a second plurality of electrically conductive plates spaced from one another and resting on the piezoelectric polymer film layer, each such plate forming a second plate of a distinct one of the transducers.

4. A micromachined ultrasonic sensing array having a plurality of piezoelectric transducers, each of which generates an electric signal corresponding to a mechanical force acoustically applied thereto, the array comprising:

a patterned substrate which is doped to render it at least moderately electrically conductive;

a composite dielectric diaphragm layer formed on the substrate;

a first plurality of electrically conductive plates spaced from one another and connectable to an external bonding pad and resting on the diaphragm layer, each such plate forming a first plate of a distinct one of the transducers;

a plurality of patterned piezoelectric polymer film layers spaced from one another and bonded to the diaphragm layer and the first plurality of electrically conductive plates; and a second plurality of electrically conductive plates spaced from one another and resting on the piezoelectric polymer film layer, each such plate forming a second plate of a distinct one of the transducers.

5. An ultrasonic sensing array as in claim 1 wherein:

the patterned substrate is provided with a plurality of holes which pass entirely through the substrate and extend to the dielectric layer, and wherein each of the holes is substantially similar in area to the first plurality of conductive plates, thereby reducing parasitic capacitance between the plates and the substrate.

6. An ultrasonic sensor array having a plurality of piezoelectric transducers, each of which is responsive to ultrasonic forces applied thereto, the array comprising:

a micromachined support substrate;

a diaphragm layer formed on one side of the substrate;

a first plurality of electrically conductive plates laterally spaced from one another on a side of the diaphragm layer opposite the substrate, each such plate being associated with a distinct one of the transducers;

at least one layer of piezoelectric material bonded to the first plurality of electrically conductive plates said layer of piezoelectric material being responsive to acoustically applied forces;

a second plurality of electrically conductive plates spaced from one another and located on a side of the layer of piezoelectric material opposite the first plurality of electrically conductive plates, each such plate of the second plurality of plates being associated with a distinct one of the transducers; and electronic circuit means for detecting analog values of said electric signal generated by said piezoelectric layer in response to an ultrasonic acoustically applied mechanical force.

7. An ultrasonic sensing array as in claim 6 wherein: the piezoelectric material is a polymer material.

8. An ultrasonic sensing array as in claim 6 wherein: the piezoelectric material is polyvinylidene difluoride (PVDF).

9. An ultrasonic sensing array as in claim 6 wherein: the piezoelectric material is a copolymer including vinylidene fluoride and trifluoroethylene.

10. An ultrasonic sensor array having a plurality of piezoelectric transducers, each of which is electrically responsive to an ultrasonic force applied thereto, the array comprising:

a patterned support substrate made of single-crystal silicon semiconductor material and having a plurality of deep recesses therein, one for each transducer;

a diaphragm layer formed on one side of the substrate and overlying at least the deep recesses in the support substrate;

a plurality of ultrasonic transducers, spaced from one another, each being electrically responsive to an ultrasonic force applied thereto transducer including:

a first electrically conductive plate resting on the diaphragm layer and overlying a distinct one of the deep recesses in the substrate;

a piezoelectric film layer bonded to the first electrically conductive plate; and a second electrically conductive plate bonded to the piezoelectric film layer on a side thereof opposite the first electrically conductive plate of the transducer.

11. An ultrasonic sensor array having a plurality of piezoelectric transducers, each of which is electrically responsive to an ultrasonic force applied thereto, the array comprising:

a patterned support substrate made of single-crystal semiconductor material and having a plurality of deep recesses therein, one for each transducer;

a diaphragm layer formed on one side of the substrate and overlying at least the deep recesses in the support substrate;

a plurality of ultrasonic transducers, spaced from one another, each transducer including:

a first electrically conductive plate resting on the diaphragm layer and overlying a distinct one of the deep recesses in the substrate;

a piezoelectric film layer bonded to the first electrically conductive plate;

a second electrically conductive plate bonded to the piezoelectric film layer on a side thereof opposite the first electrically conductive plate of the transducer; and a backing material substantially filling the deep recesses of the substrate for reflecting a major portion of the ultrasonic energy in a predetermined frequency range that passes through the plates of the transducers back toward the transducers, thereby increasing transducer sensitivity.

12. An ultrasonic sensor array having a plurality of piezoelectric transducers, each of which is electrically responsive to an ultrasonic force applied thereto, the array comprising:

a patterned support substrate made of single-crystal semiconductor material and having a plurality of deep recesses therein, one for each transducer;

a diaphragm layer formed on one side of the substrate and overlying at least the deep recesses in the support substrate;

a plurality of ultrasonic transducers, spaced from one another, each transducer including:

a first electrically conductive plate resting on the diaphragm layer and overlying a distinct one of the deep recesses in the substrate;

a piezoelectric film layer bonded to the first electrically conductive plate;

a second electrically conductive plate bonded to the piezoelectric film layer on a side thereof opposite the first electrically conductive plate of the transducer; and a backing material substantially filling the deep recesses of the substrate, the backing material having an impedance that substantially matches that of the piezoelectric film layer, thereby helping make the transducers of the array responsive to a broad range of frequencies.

13. A micromachined ultrasonic sensing array having a plurality of piezoelectric transducers, each of which generates an electric signal corresponding to a mechanical force acoustically applied thereto, the array comprising:

a patterned micromachined support substrate, the patterned substrate being provided with a plurality of holes which pass entirely through the substrate and extend to the dielectric layer, and wherein each of the holes is substantially similar in area to the first plurality of conductive plates, thereby reducing acoustic coupling between the transducers;

a composite dielectric diaphragm layer formed on the substrate;

a first plurality of electrically conductive plates spaced from one another and connectable to an external bonding pad and resting on the diaphragm layer, each such plate forming a first plate of a distinct one of the transducers;

a plurality of patterned piezoelectric polymer film layers spaced from one another and bonded to the diaphragm layer and the first plurality of electrically conductive plates, said layers of piezoelectric film being responsive to ultrasonic acoustically applied forces;

a second plurality of electrically conductive plates spaced from one another and resting on the piezoelectric polymer film layer, each such plate forming a second plate of a distinct one of the transducers;

electronic circuit means for detecting analog values of said electric signal generated by said piezoelectric layer in response to an ultrasonic acoustically applied mechanical force.

14. A micromachined ultrasonic sensing array having a plurality of piezoelectric transducers, each of which generates an electric signal corresponding to a mechanical force acoustically applied thereto, the array comprising:

a patterned micromachined support substrate, said substrate having a surface with alternating regions of two distinct levels;

a composite dielectric diaphragm layer formed on the substrate;

a first plurality of electrically conductive plates spaced from one another and connectable to an external bonding pad an resting on the diaphragm layer, each such plate forming a first plate of a distinct one of the transducers adjacent plates of each adjacent transducer being formed on said alternating regions of two distinct levels;

a plurality of patterned piezoelectric polymer film layers spaced from one another and bonded to the diaphragm layer and the first plurality of electrically conductive plates, said layers of piezoelectric film being responsive to ultrasonic acoustically applied forces;

a second plurality of electrically conductive plates spaced from one another and resting on the piezoelectric polymer film layer, each such plate forming a second plate of a distinct one of the transducers; and electronic circuit means for detecting analog values of said electric signal generated by said piezoelectric layer in response to an ultrasonic acoustically applied mechanical force.

* * * * *